United States Patent [19]
Tomita

[11] Patent Number: 6,023,083
[45] Date of Patent: Feb. 8, 2000

[54] SEMICONDUCTOR DEVICE HAVING A CONDUCTOR PATTERN SIDE FACE PROVIDED WITH A SEPARATE CONDUCTIVE SIDEWALL

[75] Inventor: Kazuo Tomita, Tokyo, Japan

[73] Assignee: Mitsubishi Denki Kabushiki Kaisha, Tokyo, Japan

[21] Appl. No.: 09/061,060

[22] Filed: Apr. 16, 1998

[30] Foreign Application Priority Data

Oct. 29, 1997 [JP] Japan .................................. 9-297230

[51] Int. Cl.$^7$ .......................... H01L 27/108; H01L 29/76; H01L 29/94
[52] U.S. Cl. .......................... 257/296; 306/298; 306/300; 306/301; 306/307; 306/317; 306/774
[58] Field of Search ..................... 257/309, 296, 257/298, 300, 301, 304, 307, 308, 317, 774, 775

[56] References Cited

U.S. PATENT DOCUMENTS 5,852,328 12/1998 Nishimura et al. ..................... 257/774

*Primary Examiner*—Carl Whitehead, Jr.
*Assistant Examiner*—Matthew E. Warren
*Attorney, Agent, or Firm*—Oblon, Spivak, McClelland, Maier & Neustadt, P.C.

[57] ABSTRACT

A semiconductor device has a conductive contact buried in a contact hole formed in an insulation film. A conductor pattern is formed on the insulation film and a separate conductive sidewall is formed on a side face of the conductor pattern over or next to the contact buried in the contact hole. The separate conductive sidewall extends on the side face above a top face of the insulation film in a direction away from the top face of the insulation film. This permits the conductor pattern to either be directly in contact with the conductive contact in the contact hole and/or to make good electrical contact with the contact in the contact hole via the separate conductive sidewall.

7 Claims, 6 Drawing Sheets

SEMICONDUCTOR DEVICE HAVING A CONDUCTOR PATTERN SIDE FACE PROVIDED WITH A SEPARATE CONDUCTIVE SIDEWALL

BACKGROUND OF THE INVENTION

1. Field of the Invention

The present invention relates to a structure of a semiconductor device and a method for manufacturing the same, and more particularly to a structure of a semiconductor device capable of suppressing disconnection of two conductors caused by a shift of superposition to obtain a capacitor having excellent electrical characteristics, and a method for manufacturing the same.

2. Description of the Background Art

FIG. 14 is a sectional view showing a structure of a semiconductor device according to the art described in Japanese Unexamined Patent Publication No. 8-306664. In FIG. 14, the reference numeral 101 denotes a semiconductor substrate, the reference numeral 102 denotes an insulation film provided on the semiconductor substrate 101, and the reference numeral 103 denotes a contact buried in the insulation film 102 with a bottom face thereof abutting on a surface of the semiconductor substrate 101. The contact 103 includes a first contact layer 104 bonded to an internal wall and a bottom face of a contact hole formed on the insulation film 102, and a plug 105 provided on the first contact layer 104 and buried in the contact hole.

Furthermore, an upper wiring 107 is formed on the contact 103 through a second contact layer 106. A protective film 108 formed of an insulating material is provided on an upper face of the upper wiring 107. A sidewall 109 formed of an insulation film is provided on side sections of the upper wiring 107 and the protective film 108. The second contact layer 106 is provided on lower faces of the sidewall 109 and the upper wiring 107.

FIGS. 15 to 18 are sectional views sequentially showing a method for manufacturing the semiconductor device shown in FIG. 14. As shown in FIG. 15, a contact hole is first formed on an insulation film 102 provided on a semiconductor substrate 101. A first contact layer 104 is provided on at least an internal wall and a bottom face of the contact hole, and a conductive film acting as a plug 105 is formed. Thus, the contact hole is filled with a conductive material. Then, a whole face is subjected to etch-back to remove the plug 105 and the first contact layer 104 which are provided on the insulation film 102. Consequently, the first contact layer 104 and the plug 105 remain only in the contact hole. Thus, a contact 103 is formed.

Thereafter, a second contact layer 106a, a conductive film 107a acting as an upper wiring 107, and a protective film 108a are sequentially provided on the contact 103 and the insulation film 102 as shown in FIG. 16.

Next, a resist pattern 110 having a width which is almost equal to a diameter of the contact 103 is formed on the protective film 108a provided above the contact 103 as shown in FIG. 17. The protective film 108a and the conductive film 107a are sequentially subjected to anisotropic etching by using the resist pattern 110 as an etching mask. Consequently, a protective film 108 and the upper wiring 107 are obtained. At this time, a shift of superposition causes a shift in a region indicated at W so that a contact area of the contact 103 and the upper wiring 107 is reduced. After this processing, the resist pattern 110 is removed.

Then, a silicon oxide film is provided on exposed faces of the second

SUMMARY OF THE INVENTION

A first aspect of the present invention is directed to a semiconductor device comprising an insulation film provided on a substrate, a contact formed of a conductive material which is provided in the insulation film and is buried in a contact hole formed from a bottom face of the insulation film to a top face thereof, a conductor pattern formed on the insulation film, and a sidewall formed of a conductive material which is provided like a frame on a side face of the conductor pattern, wherein the conductor pattern and the contact are electrically connected to each other directly or through the sidewall.

A second aspect of the present invention is directed to the semiconductor device according to the first aspect of the present invention, wherein the sidewall provided like a frame on the side face of the conductor pattern is located on the contact, and a part of the sidewall is buried in the contact hole.

A third aspect of the present invention is directed to the semiconductor device according to the first aspect of the present invention, wherein the conductor pattern and the sidewall form a wiring.

A fourth aspect of the present invention is directed to the semiconductor device according to the first aspect of the present invention, further comprising a dielectric film provided on surfaces of the conductor pattern and the sidewall, and a cell plate provided on a surface of the dielectric film, wherein the conductor pattern and the sidewall form a storage node, and a capacitor is formed by the storage node, the dielectric film and the cell plate.

A fifth aspect of the present invention is directed to the semiconductor device according to the fourth aspect of the present invention, wherein a film thickness of the conductor pattern is smaller than a vertical dimension of the sidewall, and the conductor pattern and the sidewall form a cylindrical storage node.

A sixth aspect of the present invention is directed to the semiconductor device according to the fourth aspect of the present invention, wherein a surface of the storage node which is in contact with the dielectric film is kept rough.

A seventh aspect of the present invention is directed to the semiconductor device according to the first aspect of the present invention, wherein a distance between the two adjacent conductor patterns is equivalent to a minimum dimension, and a distance between the sidewalls provided like a frame on faces on sides where the two conductor patterns are provided opposite to each other is smaller than the minimum dimension.

An eighth aspect of the present invention is directed to a method for manufacturing a semiconductor device, comprising the steps of forming a contact hole on an insulation film provided on a substrate from a top face of the insulation film to a bottom face thereof, providing a conductive material on the insulation film and filling an inside of the contact hole with the conductive material to obtain a contact, forming a resist pattern above the contact by performing a photolithographic step on the conductive material, selectively performing anisotropic etching for the conductive material by using the resist pattern as an etching mask to obtain a conductor pattern, thereby removing the resist pattern, forming a conductive film on a surface of the conductor pattern and that of the insulation film including the contact, and performing anisotropic etching for the conductive film by using the surface of the insulation film as an etching stopper to leave a conductive sidewall bonded to a side face of the conductor pattern.

A ninth aspect of the present invention is directed to the method for manufacturing a semiconductor device according to the eighth aspect of the present invention, further comprising the steps of forming a dielectric film on a surface of a storage node including the conductor pattern and the sidewall, and forming a cell plate on the dielectric film, wherein a capacitor including the storage node, the dielectric film and the cell plate is formed.

A tenth aspect of the present invention is directed to the method for manufacturing a semiconductor device according to the eighth aspect of the present invention, wherein the contact and the conductor pattern are electrically connected through the sidewall provided like a frame on the side face of the conductor pattern when at least a part of a top face of the contact and the conductor pattern are not superposed.

An eleventh aspect of the present invention is directed to a method for manufacturing a semiconductor device, comprising the steps of forming a contact hole on an insulation film provided on a substrate from a top face of the insulation film to a bottom face thereof, providing a conductive material on the insulation film and filling an inside of the contact hole with the conductive material to obtain a contact, forming a mask layer on the conductive material, forming a resist pattern above the contact by performing a photolithographic step on the mask layer, selectively performing anisotropic etching for the mask layer and the conductive material by using the resist pattern as an etching mask to obtain a mask and a conductor pattern, thereby removing the resist pattern, forming a conductive film on surfaces of the mask and the conductor pattern and a surface of the insulation film including a surface of the contact, performing anisotropic etching for the conductive film by using the surface of the insulation film as an etching stopper to leave a conductive sidewall bonded to side faces of the mask and the conductor pattern, thereby obtaining a cylindrical storage node including the conductor pattern and the sidewall, forming a dielectric film on a surface of the cylindrical storage node, and forming a cell plate on a surface of the dielectric film.

A twelfth aspect of the present invention is directed to the method for manufacturing a semiconductor device according to the eleventh aspect of the present invention, wherein the contact and the conductor pattern are electrically connected through the sidewall provided like a frame on the side face of the conductor pattern when at least a part of a top face of the contact and the conductor pattern are not superposed.

According to the first and second aspects of the present invention, even if the contact and the conductor pattern are not superposed due to a shift of photolithography, a width of the conductor pattern can effectively be increased because the sidewall formed of the conductive material is bonded to the side face of the conductor pattern. Consequently, the contact and the conductor pattern can be electrically connected well through the sidewall. If a top of the contact is subjected to over-etching due to the shift of superposition so that a recess is generated, a recess portion is filled with the conductive material forming the sidewall. Consequently, excellent electrical characteristics can be obtained.

According to the third aspect of the present invention, the wiring including the conductor pattern and the conductive sidewall is formed. Consequently, when a plurality of conductor patterns are serially provided with a minimum sampling dimension, a wiring width can effectively be increased by a horizontal dimension of the sidewall and a distance between the wirings can be reduced without expanding an element formation region.

According to the fourth aspect of the present invention, an influence of the shift of superposition of the contact and the storage node can be reduced, and excellent electrical connection can be obtained. In addition, it is possible to obtain a semiconductor device comprising a highly integrated capacitor.

According to the fifth aspect of the present invention, the cylindrical storage node is formed. Consequently, it is possible to obtain a semiconductor device comprising a capacitor having a large capacity.

According to the sixth aspect of the present invention, a surface of the storage node is made rough. Consequently, it is possible to obtain a semiconductor device comprising a capacitor having a larger capacity.

According to the seventh aspect of the present invention, if a plurality of conductor patterns are serially provided with a minimum sampling dimension, a wiring width can effectively be increased by a horizontal dimension of the sidewall and a distance between the wirings can be reduced without expanding an element formation region.

According to the eighth aspect of the present invention, the shift of superposition of the contact and the conductor pattern can be corrected by forming the conductive sidewall. Furthermore, the wiring width can be made greater without increasing a wiring pitch.

According to the ninth aspect of the present invention, an influence of the shift of superposition of the contact and the storage node can be reduced, and excellent electrical connection can be obtained. In addition, it is possible to obtain a semiconductor device comprising a highly integrated capacitor.

According to the tenth aspect of the present invention, even if the top face of the contact and the conductor pattern or storage node are not superposed due to the shift of superposition, it is possible to obtain excellent electrical connection with the contact through the conductive sidewall provided like a frame on the side face of the conductor pattern or storage node.

According to the eleventh aspect of the present invention, an influence of the shift of superposition of the contact and the storage node can be reduced and excellent electrical connection can be obtained. In addition, a semiconductor device comprising a capacitor having a large capacity can be obtained by formation of the cylindrical storage node.

According to the twelfth aspect of the present invention, even if the top face of the contact and the conductor pattern or storage node are not superposed due to the shift of superposition, it is possible to obtain excellent electrical connection with the contact through the conductive sidewall provided like a frame on the side face of the conductor pattern or storage node.

In order to solve the above-mentioned problems, it is an object of the present invention to provide a semiconductor device capable of performing excellent electrical connection of a contact to a wiring or an electrode for electrical connection with the contact even if an influence of a shift of superposition is increased with finer structures of elements, and a method for manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
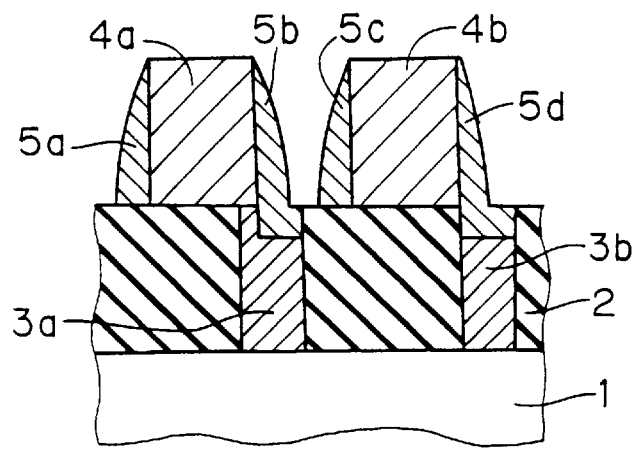
FIG. 1 is a sectional view showing a structure of a semiconductor device according to a first embodiment of the present invention.

FIG. 1 is a sectional view showing a structure of a semiconductor device according to a first embodiment of the present invention. In FIG. 1, the reference numeral 1 denotes a semiconductor substrate, the reference numeral 2 denotes an insulation film formed of a silicon oxide film which is provided on the semiconductor substrate 1, the reference numerals 3a and 3b denote contacts which are buried in the insulation film 2 respectively and abut on a conductive region formed in a surface region of the semiconductor substrate 1, the reference numerals 4a and 4b denote wirings which are electrically connected to the contacts 3a and 3b directly or through another conductive film respectively, the reference numerals 5a and 5b denote sidewalls formed of a conductive material which are bonded to side sections of the wiring 4a, and the reference numerals 5c and 5d denote sidewalls formed of a conductive material which are bonded to side sections of the wiring 4b.

The wiring 4a and the contact 3a, and the wiring 4b and the contact 3b are formed with a shift of superposition, respectively. A top face of the contact 3a and a bottom face of the wiring 4a are provided partially in contact with each other. Since the sidewall 5b is provided, the contact 3a is electrically connected to the wiring 4a in good condition. The contact 3b and the wiring 4b are not superposed but are formed adjacently to each other and electrically connected to each other through the sidewall 5d.

A space between the wirings 4a and 4b has a minimum sampling dimension of 0.25 μm, for example. Accordingly, a distance between a peripheral end of the side wall 5b bonded to the wiring 4a and that of the sidewall 5c bonded to the adjacent wiring 4b is smaller than the minimum sampling dimension.

Furthermore, lower portions of the sidewalls 5b and 5d are buried in the insulation film 2, and surfaces of the sidewalls 5b and 5d provided on the contacts 3a and 3b are on a level with a surface of the insulation film 2 or are higher than the surface of the insulation film 2.

Figure 2:
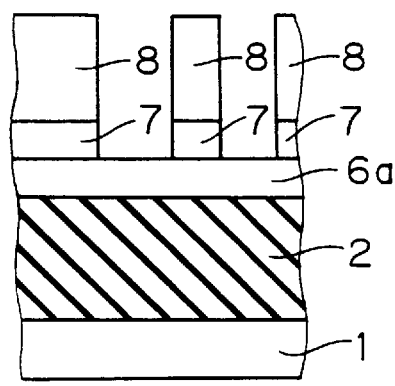
FIG. 2 is a sectional view sequentially showing a method for manufacturing the semiconductor device according to the first embodiment of the present invention.
Figure 3:
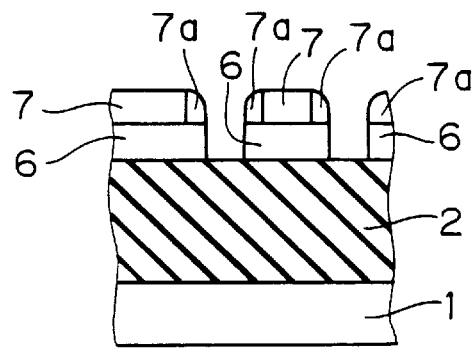
FIG. 3 is a sectional view sequentially showing the method for manufacturing the semiconductor device according to the first embodiment of the present invention.
Figure 4:
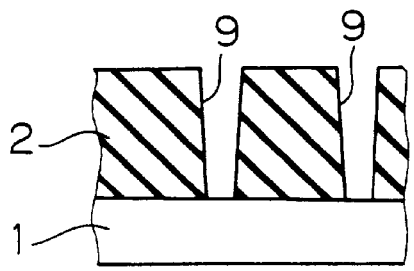
FIG. 4 is a sectional view sequentially showing the method for manufacturing the semiconductor device according to the first embodiment of the present invention.

FIGS. 2 to 7 are sectional views sequentially showing a method for manufacturing the semiconductor device in FIG. 1. As shown in FIGS. 2 to 4, a contact hole having a smaller opening diameter than a minimum sampling dimension is first formed in an insulation film 2 by a polymask opening method. First of all, the insulation film 2 having a thickness of about 6000 Å which is formed of a silicon oxide film, a polysilicon film 6a having a thickness of about 3000 Å, and a silicon oxide film 7 having a thickness of about 3000 Å are sequentially provided on a semiconductor substrate (p—type silicon substrate, resistivity: 10 Ω·cm) 1 as shown in FIG. 2. Then, a resist pattern 8 is formed as an etching mask to pattern the silicon oxide film 7. A distance between two adjacent resist patterns 8 is set to a minimum sampling dimension of 0.25 μm, for example. The silicon oxide film 7 is subjected to anisotropic etching by using the resist pattern 8 as an etching mask so that pattern formation is performed.

Next, the resist pattern 8 is removed and a silicon oxide film is provided by a CVD method as shown in FIG. 3. Then, a sidewall 7a is provided like a frame on a side section of the silicon oxide film 7 patterned by performing the anisotropic etching. Thereafter, the polysilicon film 6a is subjected to the anisotropic etching by using the silicon oxide film 7 and the sidewall 7a as etching masks to perform patterning. Thus, a mask pattern 6 formed of polysilicon is obtained.

Subsequently, the insulation film 2 is subjected to the anisotropic etching by using the mask pattern 6 to form a contact hole 9 as shown in FIG. 4. At the same time, the silicon oxide film 7 and the sidewall 7a may also be removed by etching. After the mask pattern 6 is subjected to the patterning, the silicon oxide film 7 and the sidewall 7a may be removed before the contact hole is formed. After the contact hole 9 is formed, a resist is buried in an opening of the contact hole 9, for example. Thus, the mask pattern 6 is also removed by etching.

The contact hole 9 thus obtained has an opening diameter which is smaller than the minimum sampling dimension by a width that is twice as much as a width of the sidewall 7a. The contact hole 9 having the opening diameter which is smaller than the minimum sampling dimension may be formed by anther manufacturing method.

Figure 5:
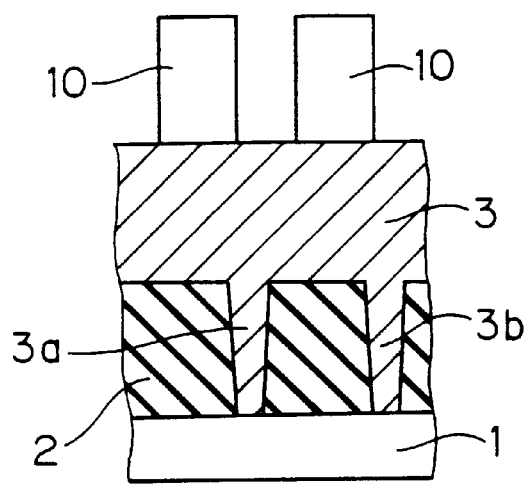
FIG. 5 is a sectional view sequentially showing the method for manufacturing the semiconductor device according to the first embodiment of the present invention.

As shown in FIG. 5, a doped polysilicon film 3 is provided in a thickness of about 6000 Å on the insulation film 2 by the CVD method, and is buried in the contact hole 9 to form contacts 3a and 3b. Furthermore, a resist pattern 10 corresponding to shapes of wirings 4a and 4b is formed as an etching mask on a surface of the doped polysilicon film 3.

It is assumed that a distance between two adjacent resist patterns 10 is equivalent to the minimum sampling dimension. It is ideal that the resist pattern 10 is completely superposed on the contacts 3a and 3b. In some cases, however, the resist pattern 10 is not completely superposed on the contacts 3a and 3b due to a shift. In the present embodiment, the case where the shift of superposition is caused will be described.

Figure 6:
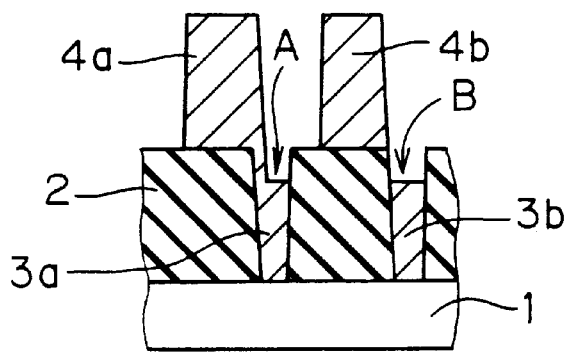
FIG. 6 is a sectional view sequentially showing the method for manufacturing the semiconductor device according to the first embodiment of the present invention.

Then, the doped polysilicon film 3 is subjected to anisotropic etching by using the resist pattern 10 as an etching mask to obtain the wirings 4a and 4b as shown in FIG. 6. At this time, the doped polysilicon film 3 is subjected to the etching on the etching condition that a selection ratio of the etching can fully be kept for the silicon oxide film, for example, by using a mixed gas of $Cl_2$ and $O_2$ with an ECR device. The resist pattern 10 is removed by a method such as wet etching. By the etching, regions in upper portions of the contacts 3a and 3b which are not superposed on the resist pattern 10 are subjected to over-etching so that recesses A and B are formed.

Figure 7:
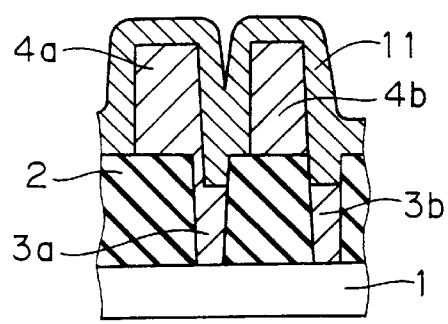
FIG. 7 is a sectional view sequentially showing the method for manufacturing the semiconductor device according to the first embodiment of the present invention.

Next, a doped polysilicon film 11 is provided in a thickness of about 1500 Å on surfaces of the wirings 4a and 4b and the insulation film 2 and the inside of the recesses A and B as shown in FIG. 7. The doped polysilicon film 11 is formed by a CVD method or a sputtering method, for example. Then, RIE anisotropic etching is performed by using the insulation film 2 as an etching stopper, thereby forming the doped polysilicon film 11 into sidewalls 5a, 5b, 5c and 5d bonded to side sections of the wirings 4a and 4b as shown in FIG. 1. At this time, a part of the sidewalls 5b and 5d are also buried in the recesses A and B so that the same state as the case where the recesses A and B are not formed on the contacts 3a and 3b is effectively obtained.

In the semiconductor device thus formed, respective junctions of the contacts 3a and 3b having smaller diameters than the minimum sampling dimension and the fine wirings 4a and 4b can be ensured by providing, like a frame, the sidewalls 5a, 5b, 5c and 5d formed of a conductive material on the side sections of the wirings 4a and 4b. Thus, excellent electrical characteristics can be obtained. By the anisotropic etching to be performed when the wirings 4a and 4b are subjected to the patterning, the recesses A and B formed in upper portions of the contacts 3a and 3b can be filled with the sidewalls 5a, 5b, 5c and 5d. Thus, an effective contact diameter can be prevented from being decreased.

In the semiconductor device thus formed, furthermore, a space between the wirings 4a and 4b is equivalent to the minimum sampling dimension, and the sidewalls 5a, 5b, 5c and 5d are bonded to the side sections of the wirings 4a and 4b. Consequently, an effective wiring width can be made greater without increasing a wiring pitch, and high integration of elements can be obtained without increasing an element formation area. In other words, the high integration can be obtained by decreasing the space between the wirings. For example, the effective wiring width is a total of horizontal dimensions of the wiring 4a and the sidewalls 5a and 5b, and so is a wiring 4b side.

Only an example of the dimension of the element has been described above. While an example in which the wirings 4a and 4b are formed from the doped polysilicon film 3 having a thickness of about 6000 Å has been described, for example, a doped polysilicon film having a thickness of about 100 to 20000 Å may be used depending on a suitable device. Similarly, the doped polysilicon 11 provided to obtain the sidewalls 5a, 5b, 5c and 5d may have a thickness of about 50 to 3000 Å.

Furthermore, a material forming the wirings 4a and 4b is not limited to doped polysilicon but may be another conductive material such as WSi, TiSi, MoSi, Al, AlCu, TiN, Ti, Pt, Ru or $RuO_2$. The case where the contact diameter is smaller than the minimum sampling diameter has been described as an example in which the element has a finer structure, and is not limited thereto. It is needless to say that excellent electrical connection can be obtained if the contacts 3a and 3b are superposed on the wirings 4a and 4b without a shift.

Second Embodiment

In the first embodiment, the example in which the wiring 4a and the sidewalls 5a and 5b or the wiring 4b and the sidewalls 5c and 5d effectively act as wirings has been described. In a second embodiment, there will be described the case where an electrode 4aa corresponding to the wiring 4a and sidewalls 5a and 5b which are provided like a frame on side sections of the electrode 4aa and are formed of a conductive material are effectively used as a storage node which is one of electrodes of a capacitor.

Figure 8:
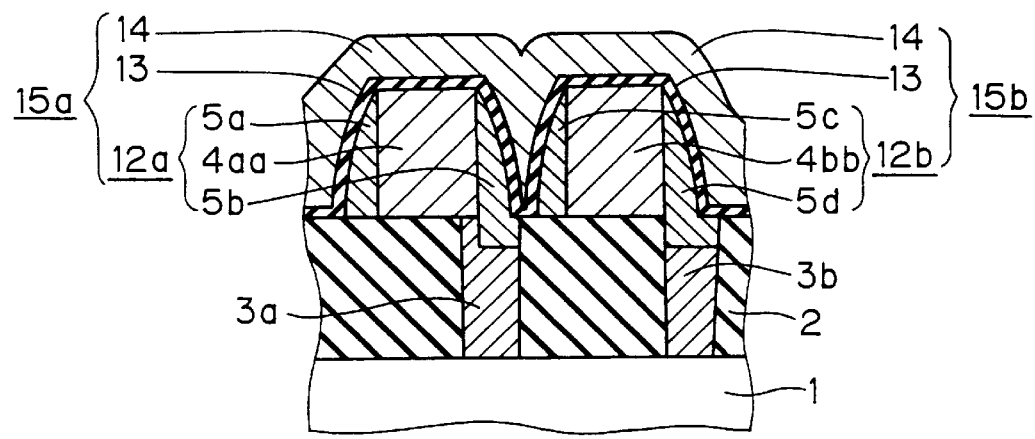
FIG. 8 is a sectional view showing a structure of a semiconductor device according to a second embodiment of the present invention.

FIG. 8 is a sectional view showing a structure of a semiconductor device according to the second embodiment of the present invention. In FIG. 8, the reference numerals 4aa and 4bb denote electrodes which are electrically connected to contacts 3a and 3b buried in an insulation film 2. The reference numerals 12a and 12b denote storage nodes formed by the electrodes 4aa and 4bb, and the sidewalls 5a and 5b and the sidewalls 5c and 5d which are bonded to side sections of the electrodes 4aa and 4bb, respectively. The reference numeral 13 denotes a dielectric film provided on surfaces of the storage nodes 12a and 12b. The reference numeral 14 denotes a cell plate provided on a surface of the dielectric film 13. The reference numerals 15a and 15b denote capacitors including the storage nodes 12a and 12b, the dielectric film 13 and the cell plate 14, respectively. The same reference numerals as in the above description denote the same or corresponding portions.

Next, a method for manufacturing the semiconductor device shown in FIG. 8 will be described below. First of all, manufacture is performed according to the steps shown in FIGS. 2 to 4 in accordance with the first embodiment. Thus, a contact hole 9 is formed on an insulation film 2 provided on a semiconductor substrate 1. Then, a doped polysilicon film 3 is provided in a thickness of about 6000 Å in the same manner as in FIG. 4. While the resist pattern 10 having a shape corresponding to the shapes of the wirings 4a and 4b has been formed in the first embodiment, a resist pattern has a shape corresponding to shapes of the electrodes 4aa and 4bb forming the storage nodes in the second embodiment.

Thereafter, a processing is performed according to the steps shown in FIGS. 6 and 7 in accordance with the first embodiment. Furthermore, sidewalls 5a, 5b, 5c and 5d formed of a conductive material are provided on side sections of the electrodes 4aa and 4bb. Next, a dielectric film 13 including a silicon oxide film, a silicon nitride film, and a composite film (an ON film) of an oxide film and a nitride film is at least provided in a thickness of about 50 Å on surfaces of the electrodes 4aa and 4bb and the sidewalls 5a, 5b, 5c and 5d. Subsequently, a cell plate 14 formed of doped polysilicon which has a thickness of about 1500 Å is provided on a surface of the dielectric film 13. Thus, the capacitors 15a and 15b shown in FIG. 8 can be obtained.

In the semiconductor device shown in FIG. 8, the sidewalls 5a, 5b, 5c and 5d are formed on the side sections of the electrodes 4aa and 4bb, and the storage nodes 12a and 12b are formed by the electrodes 4aa and 4bb, and the sidewalls 5a and 5b and the sidewalls 5c and Sd, respectively. Accordingly, a surface area of the storage node can be increased as compared with the case where the storage node is formed by only the electrodes 4aa and 4bb. Consequently, capacities of the capacitors 15a and 15b can be increased. After the sidewalls 5a, 5b, 5c and 5d are formed, exposed faces of the storage nodes 12a and 12b can be made rough to further increase the surface area, thereby increasing the capacities of the capacitors 15a and 15b.

Upper ends of the storage nodes 12a and 12b are rounded. Therefore, a deterioration in a breakdown voltage and generation of a leak current can be prevented from being caused by electrostatic focusing.

Also in the case where thick film stack type storage nodes 12a and 12b and contacts 3a and 3b have no superposition allowance, an excellent connection state can be obtained because the sidewalls 5a, 5b, 5c and 5d formed of a conductive material are provided as described in the first embodiment.

While the sidewalls 5a, 5b, 5c and 5d have been formed of the doped polysilicon in the above description, they may be formed of another material, for example, doped amorphous silicon or a metal such as Ta, Ti, TiN, Pt, Ru or RuO. Alternatively, it is possible to use a method in which the sidewalls 5a, 5b, 5c and 5d are formed of polysilicon containing no impurity and, for example, arsenic (in case of P type) is then implanted at 50 keV, $4 \times 10^{15}/cm^2$ and an implantation angle of 7° to make a conductive material.

Figure 9:
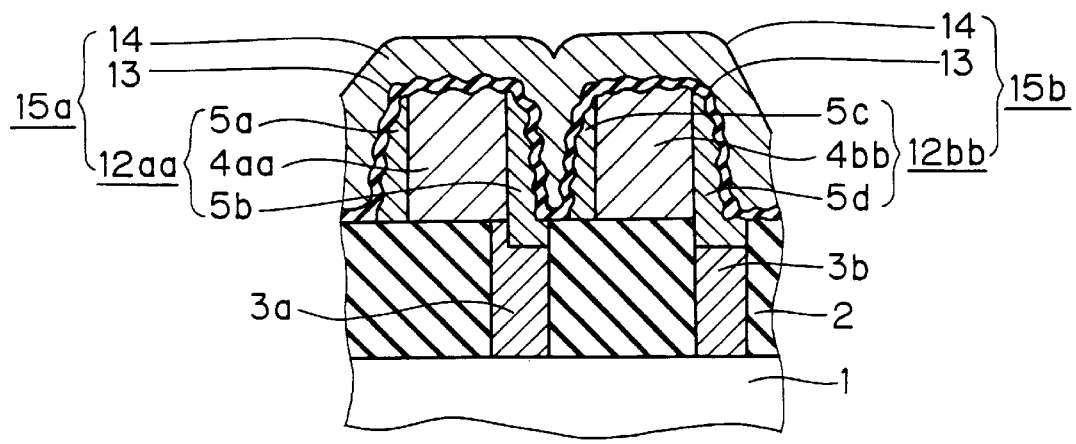
FIG. 9 is a sectional view showing another structure of the semiconductor device according to the second embodiment of the present invention.

The dielectric film 13 may be a silicon oxide film, a silicon nitride film, an ON film, a high dielectric film such as $Ta_2O_5$ or (Ba, Sr)$TiO_3$, or a ferroelectric film such as $BaTiO_3$, $SrTiO_3$, $PbTiO_3$, $PbZrO_3$, $LiNbO_3$, PZT or PLZT. As shown in FIG. 9, storage nodes 12aa and 12bb having rough surfaces are formed so that the capacities of the capacitors 15a and 15b can be increased. Furthermore, it is needless to say that a dimension of a component can be varied depending on a suitable device.

Third Embodiment

Figure 10:
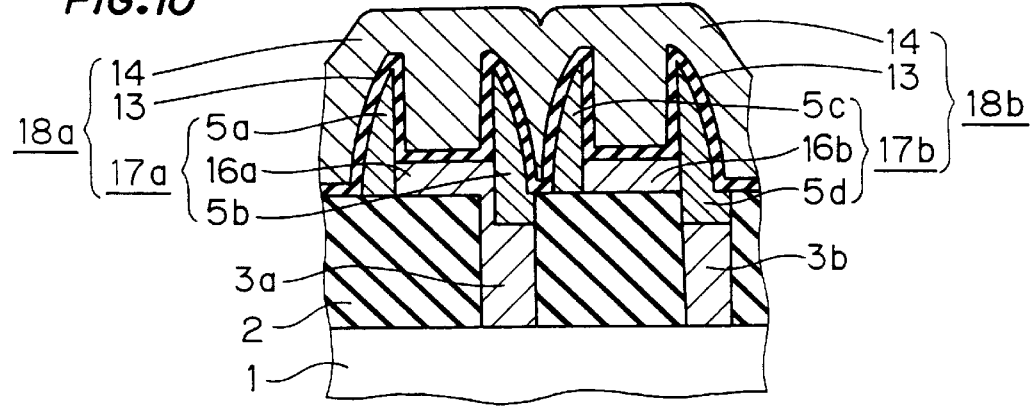
FIG. 10 is a sectional view showing a structure of a semiconductor device according to a third embodiment of the present invention.

A semiconductor device comprising a capacitor having a larger capacity than that of each of the capacitors 15a and 15b according to the second embodiment will be described in a third embodiment. FIG. 10 is a sectional view showing a structure of the semiconductor device according to the third embodiment of the present invention. In FIG. 10, the reference numerals 16a and 16b denote electrodes formed of a conductive material which have smaller thicknesses than a vertical dimension of each of sidewalls 5a, 5b, 5c and 5d bonded to side sections thereof, the reference numeral 17a denotes a cylindrical storage node formed by the electrode 16a and the sidewalls 5a and 5b bonded to the side sections of the electrode 16a, and the reference numeral 17b denotes a cylindrical storage node formed by the electrode 16b and the sidewalls 5c and 5d.

While the sidewalls 5a and 5b and the sidewalls 5c and 5d are indicated by separate designations in FIG. 10, the sidewalls 5a and 5b are serially formed as a cylinder extending in a vertical direction along a periphery of the electrode 16a, for example, and so are the sidewalls 5c and 5d. The reference numerals 18a and 18b denote capacitors formed by the storage nodes 17a and 17b, a dielectric film 13 and a cell plate 14, respectively.

Figure 11:
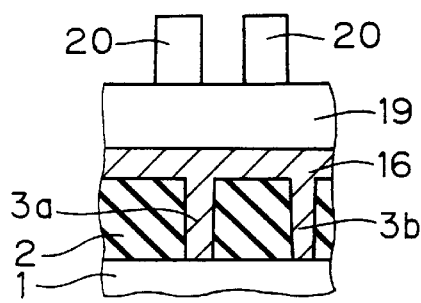
FIG. 11 is a sectional view sequentially showing a method for manufacturing the semiconductor device according to the third embodiment of the present invention.

A method for manufacturing the semiconductor device shown in FIG. 10 will be described below. First of all, a processing is performed according to the steps of the manufacturing method shown in FIGS. 2 to 4 in accordance with the first embodiment. Thus, a contact hole 9 is formed on an insulation film 2 provided on a semiconductor substrate 1. As shown in FIG. 11, a doped polysilicon film 16 is then provided in a thickness of about 1500 Å by a CVD method to fill in the contact hole 9. Consequently, contacts 3a and 3b are obtained. Furthermore, a BPTEOS film (mask layer) 19 is provided in a thickness of about 6000 Å. A resist pattern 20 having a shape corresponding to shapes of electrodes 16a and 16b is formed on a surface of the BPTEOS film 19. It is assumed that a distance between two adjacent resist patterns 20 is equivalent to a minimum sampling dimension (0.25 μm).

Figure 12:
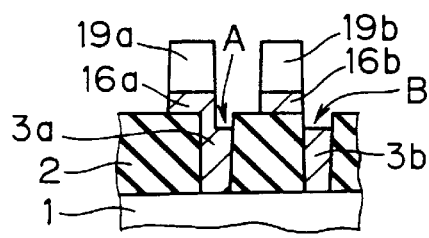
FIG. 12 is a sectional view sequentially showing the method for manufacturing the semiconductor device according to the third embodiment of the present invention.

Next, the BPTEOS film 19 and the doped polysilicon film 16 are subjected to etching by using the resist pattern 20 as an etching mask as shown in FIG. 12. The etching is performed by using a mixed gas of $CHF_3$, Ar and $O_2$ with an ECR device, for example, on the condition that a selection ratio of the etching can fully be kept for a silicon oxide film. Consequently, BPTEOS patterns (masks) 19a and 19b and the electrodes 16a and 16b are obtained. By the etching, regions in upper portions of the contacts 3a and 3b which are not superposed on the resist pattern 20, that is, regions which correspond to a shift of superposition are subjected to over-etching. Consequently, recesses A and B are formed. Then, the resist pattern 20 is removed.

Figure 13:
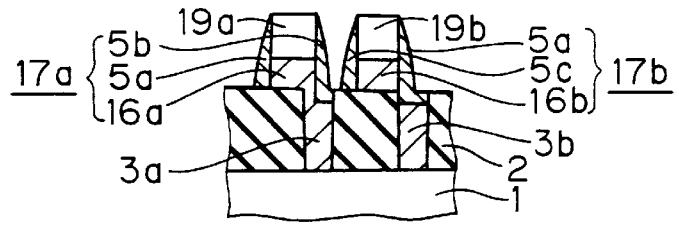
FIG. 13 is a sectional view sequentially showing the method for manufacturing the semiconductor device according to the third embodiment of the present invention.
Figure 14:
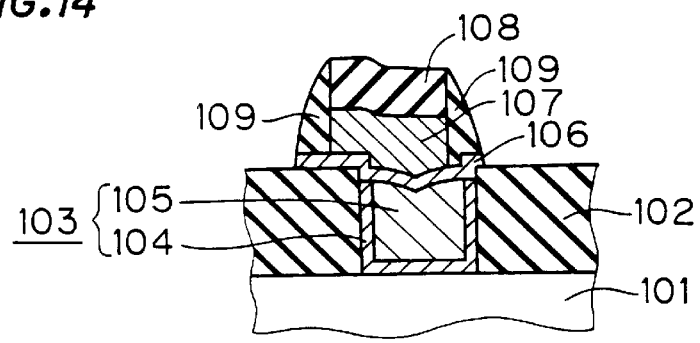
FIG. 14 is a sectional view showing a structure of a semiconductor device according to the prior art.
Figure 15:
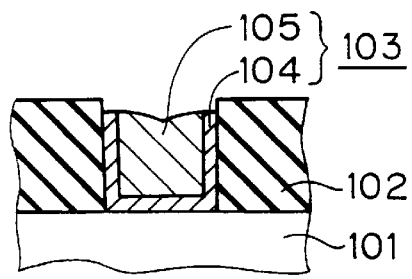
FIG. 15 is a sectional view sequentially showing a method for manufacturing the semiconductor device according to the prior art.
Figure 16:
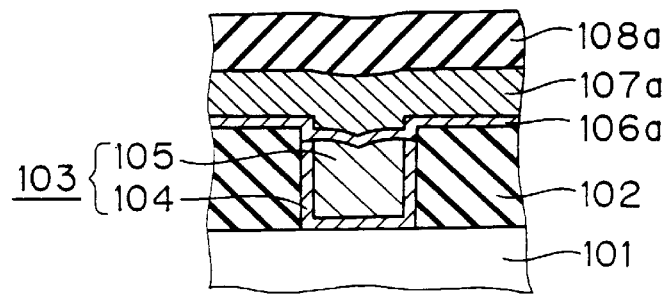
FIG. 16 is a sectional view sequentially showing the method for manufacturing the semiconductor device according to the prior art.
Figure 17:
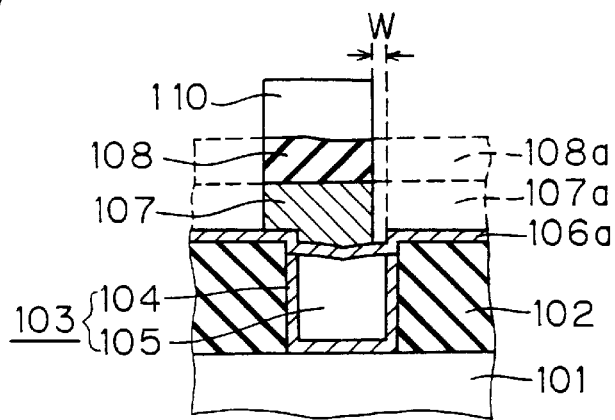
FIG. 17 is a sectional view sequentially showing the method for manufacturing the semiconductor device according to the prior art.
Figure 18:
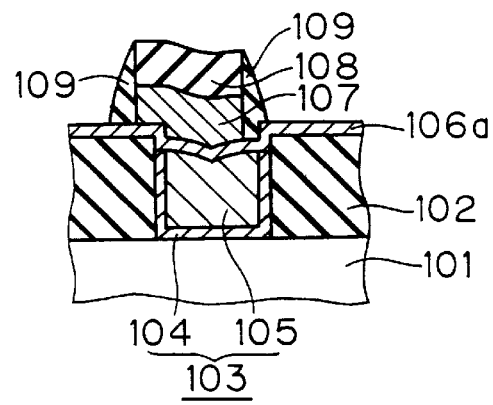
FIG. 18 is a sectional view sequentially showing the method for manufacturing the semiconductor device according to the prior art.
Figure 19:
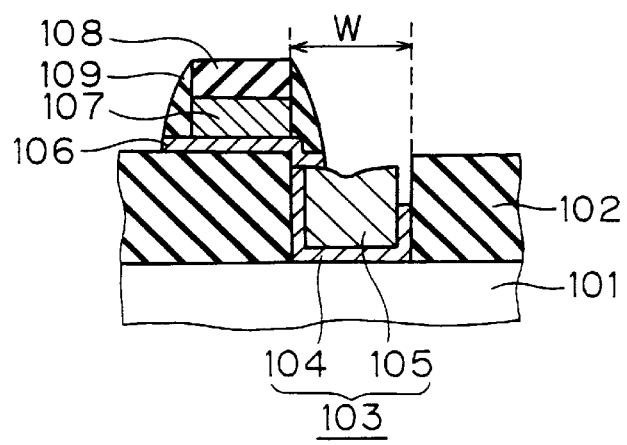
FIG. 19 is a sectional view showing a structure of the semiconductor device according to the prior art.

Thereafter, doped polysilicon is provided in a thickness of about 1500 Å on exposed surfaces of the insulation film 2, the BPTEOS patterns 19a and 19b, the electrodes 16a and 16b, and the contacts 3a and 3b, and is subjected to etch-back by a RIE method, for example, so that sidewalls 5a, 5b, 5c and 5d are formed as shown in FIG. 13. Also in the semiconductor device according to the third embodiment, the sidewalls 5b and 5d are formed to fill in the recesses A and B on the top of the contacts 3a and 3b so that effective surfaces of the contacts 3a and 3b are set higher than a surface of the insulation film 2 in the same manner as in the first embodiment. Furthermore, the electrode 16b and the contact 3b which are not superposed due to a shift can also be electrically connected well through the sidewall 5d formed of a conductive material. At this stage, a cylindrical storage node 17a including the sidewalls 5a and 5b and the electrode 16a, and a cylindrical storage node 17b including the sidewalls 5c and 5d and the electrode 16b are obtained.

Subsequently, the BPTEOS patterns 19a and 19b provided on the electrodes 16a and 16b are selectively removed by etching. In order to keep a selection ratio to other components depending on a device, it is also possible to form patterns corresponding to the BPTEOS patterns 19a and 19b by using a material other than BPTEOS.

Subsequent steps are the same as the steps of forming the dielectric film 13 and the cell plate 14 in the second embodiment. The semiconductor device comprising the capacitors 18a and 18b shown in FIG. 10 can be obtained by sequentially forming the dielectric film 13 and the cell plate 14 on at least the exposed surfaces of the sidewalls 5a, 5b, 5c and 5d and the electrodes 16a and 16b.

In such a semiconductor device, faces of the storage nodes 17a and 17b on electrode 16a and 16b sides are exposed and formed cylindrically, thereby increasing a surface area. Accordingly, capacities of the capacitors 18a and 18b can efficiently be increased with high integration by setting a distance between the storage nodes 17a and 17b smaller than the minimum sampling dimension. It is needless to say that the capacitors 18a and 18b having larger capacities can be obtained by making surfaces of the storage nodes 17a and 17b rough in the same manner as the case shown in FIG. 9 according to the second embodiment.

While the invention has been described in detail, the foregoing description is in all aspects illustrative and not restrictive. It is understood that numerous other modifications and variations can be devised without departing from the scope of the invention.

I claim:

1. A semiconductor device comprising:
    an insulation film provided on a substrate;
    a conductive contact buried in a contact hole, said contact hole extending from a bottom face of said insulation film to a top face thereof;
    a first conductor pattern formed on said insulation film; and
    a separate conductive sidewall formed so as to extend above said top face in a direction away from said top face on a first side face of said first conductor pattern,
    wherein said first conductor pattern and said conductive contact are electrically connected to each other directly or through said separate conductive sidewall.

2. The semiconductor device according to claim 1, wherein said separate conductive sidewall is located on said conductive contact, and a part of said separate conductive sidewall is buried in said contact hole.

3. The semiconductor device according to claim 1, wherein said first conductor pattern and said separate conductive sidewall form a wiring.

4. The semiconductor device according to claim 1, further comprising:
    a dielectric film provided on surfaces of said first conductor pattern and said separate conductive sidewall; and
    a cell plate provided on a surface of said dielectric film,
    wherein said first conductor pattern and said separate conductive sidewall form a storage node, and
    a capacitor is formed by said storage node, said dielectric film, and said cell plate.

5. The semiconductor device according to claim 4, wherein a film thickness of said first conductor pattern is smaller than a vertical dimension of said separate conductive sidewall, and
    said first conductor pattern and said separate conductive sidewall form a cylindrical storage node.

6. The semiconductor device according to claim 4, wherein a surface of said storage node which is in contact with said dielectric film is kept rough.

7. The semiconductor device according to claim 1, wherein a further conductor pattern is formed on said insulation film so as to provide a minimum sampling dimension between said first and said further conductor patterns, said further conductor pattern having a further side face facing said first side face and having a further separate conductive sidewall formed thereon, and
    wherein a distance between said separate conductive sidewalls is smaller than said minimum sampling dimension.

* * * * *